United States Patent [19]

Juskey et al.

[11] Patent Number: 5,716,760
[45] Date of Patent: Feb. 10, 1998

[54] METHOD FOR PLATING A SUBSTRATE TO ELIMINATE THE USE OF A SOLDER MASK

[75] Inventors: Frank Juskey, Coral Springs; Jonathon G. Greenwood, Boynton Beach; Douglas W. Hendricks, Boca Raton, all of Fla.

[73] Assignee: Motorola, Inc., Schaumburg, Ill.

[21] Appl. No.: 810,272

[22] Filed: Mar. 3, 1997

Related U.S. Application Data

[63] Continuation of Ser. No. 442,187, May 16, 1995, abandoned.

[51] Int. Cl.$^6$ ........................................................ G03F 7/00
[52] U.S. Cl. ............................ 430/315; 427/96; 427/123
[58] Field of Search ............................ 430/311, 315, 430/324; 427/58, 96, 97, 123, 125

[56] References Cited

U.S. PATENT DOCUMENTS

| | | | |
|---|---|---|---|
| 5,250,105 | 10/1993 | Gomes | 106/1.11 |
| 5,311,660 | 5/1994 | Alpaugh | 29/852 |

*Primary Examiner*—Kathleen Duda
*Attorney, Agent, or Firm*—Philip P. Macnak

[57] ABSTRACT

A novel process for plating a substrate without solder mask wherein the substrate is coated with a polymer catalyst to assist adhesion of conductive metal to the substrate. Next, a first plating mask photopolymer, or plating resist, is coated over the polymer catalyst, a circuit pattern is imaged onto the first plating mask and the first plating mask is developed to reveal windows, or circuit traces, in the first plating mask corresponding to the circuit pattern to be embodied on the substrate. Thereafter, a first conductive material such as copper is plated into the windows, and, thereafter, a second conductive material such as nickel may be plated into the windows on top of the first conductive material. Then, the first plating mask is removed from the substrate, leaving behind the conductive material in the form of the desired circuit pattern. Next, a second plating mask photopolymer is formed over the substrate and conductive materials, and an I/O interconnect mask corresponding to the I/O interconnect pads is photo-optically imaged onto the second plating mask and the second plating mask is developed to remove portions thereof, creating "interconnect voids," corresponding to the interconnect pads. Thereafter, a third conductive material such as gold is plated into the interconnect voids to create conductive I/O pads.

30 Claims, 4 Drawing Sheets

METHOD FOR PLATING A SUBSTRATE TO ELIMINATE THE USE OF A SOLDER MASK

This is a continuation of application Ser. No. 08/442,187, filed May 16, 1995 and now abandoned.

FIELD OF THE INVENTION

This invention relates to a process for electrolessly plating rigid or flexible printed circuit boards in such a way that the use of a solder mask is eliminated.

BACKGROUND OF THE INVENTION

Miniaturization of standard integrated circuit (IC) components, such as memory chips and microprocessors, has advanced at a surprising rate. As a result, the tolerances needed to connect the input/output (I/O) terminals of the components to the printed circuit carriers (PCCs) have become so small that standard mounting techniques are unsatisfactory.

A significant problem with the current techniques with which the I/O "pads," or contact points, are formed on the PCCs arises out of the use of "solder mask." Solder mask is a layer which is formed over the substrate and over the conductive runners and pads which comprise the printed circuit. Solder mask is undesirably thick (approximately 1 mil), resulting in I/O connection points on the PCC which are recessed within a window in the solder mask. This yields the problems of "scumming" of the pads with solder mask residue, usually preventing the I/O leads on the IC components from making good electrical contact with the I/O pad on the substrate. The presence of a window also makes it difficult to align the I/O leads with their corresponding pad.

In addition, the use of solder mask over the substrate introduces tolerance problems and contamination. Currently, solder mask is used to eliminate solder scavenging during infrared surface mount technology (SMT) reflow and to define integrated circuit ball grid array (BGA) and direct chip attach (DCA) pads. However, while the solder masking process performs these tasks, it is also the leading cause of defects, specifically in the DCA and BGA processes, due to registration and contamination problems. To eliminate the solder mask and associated defects, a new plating process is required which utilizes the underlying metal, for example nickel, to control solder scavenging and define pads.

Even further, the thickness of the solder mask adds rigidity to the circuit carrier, which is most undesirable where flexible circuit carriers are involved.

However, even if solder mask were eliminated, there is still a need to prevent the solder joints from being starved of solder, and to prevent solder from running together and causing shorts, during the process of connecting the IC components to the circuit carrier.

SUMMARY OF THE INVENTION

To that end, this invention involves a novel process for plating a substrate without solder mask, and thereby overcoming the previously mentioned disadvantages and yielding additional advantages. This invention allows for the use of reduced-sized I/O pads, which allows for a reduced distance between I/O pad centers, which in turn allows for smaller IC component sizes. The present invention comprises a method for plating a circuit carrying substrate without the use of solder mask, wherein the substrate is coated with a polymer catalyst to assist adhesion of conductive metal to the substrate, a first plating mask photopolymer, or plating resist, is coated over the polymer catalyst, a circuit pattern is photo-optically imaged onto the first plating mask and the first plating mask is then developed to reveal windows, or circuit traces, in the first plating mask corresponding to the circuit pattern to be embodied on the substrate. Thereafter, a first conductive material such as copper is plated into the windows, and, thereafter, a second conductive material such as nickel may be plated into the windows on top of the first conductive material. Then, the first plating mask is removed from the substrate, leaving behind the conductive circuit traces in the form of the desired circuit pattern. Next, a second plating mask photopolymer is formed over the substrate and circuit traces, and an I/O interconnect mask corresponding to the I/O interconnect pads is photo-optically imaged onto the second plating mask and the second plating mask is developed to remove portions thereof corresponding to the interconnect pads. Thereafter, a third conductive material such as gold is plated into the thus created voids in the second plating mask layer to create conductive I/O pads. Optionally, either the first or second plating mask photopolymer layers, or both of them, may be left on the substrate throughout the process discussed herein.

The result is a miniarurized, precise, printed circuit pattern having I/O interconnection pads which are closely spaced and raised slightly above the topology of the substrate and added layers so as to facilitate the connection of the IC component leads to the pads.

BRIEF DESCRIPTION OF THE DRAWINGS

A preferred embodiment of the invention will now be described with reference to the accompanying drawings, wherein.

DESCRIPTION OF THE PREFERRED EMBODIMENT

The present invention utilizes an additive circuit plating process to mask a substrate without the use of solder mask. A photo-imaged negative mask is applied over a catalyst to generate the positive artwork for subsequent plating. Copper is then plated onto the substrate followed by nickel. The mask is then removed and a second photo-imaged mask is applied, defining the SMT, DCA, and/or BGA pads. Gold is then plated and the second mask is removed. During assembly, the solder, eutectic bumps and/or spheres will only wet to the gold and not the oxidized nickel, eliminating the need for a final solder mask.

By "additive" is meant that a copper foil is not laminated to both surfaces of the substrate prior to circuit definition.

Figure 1:
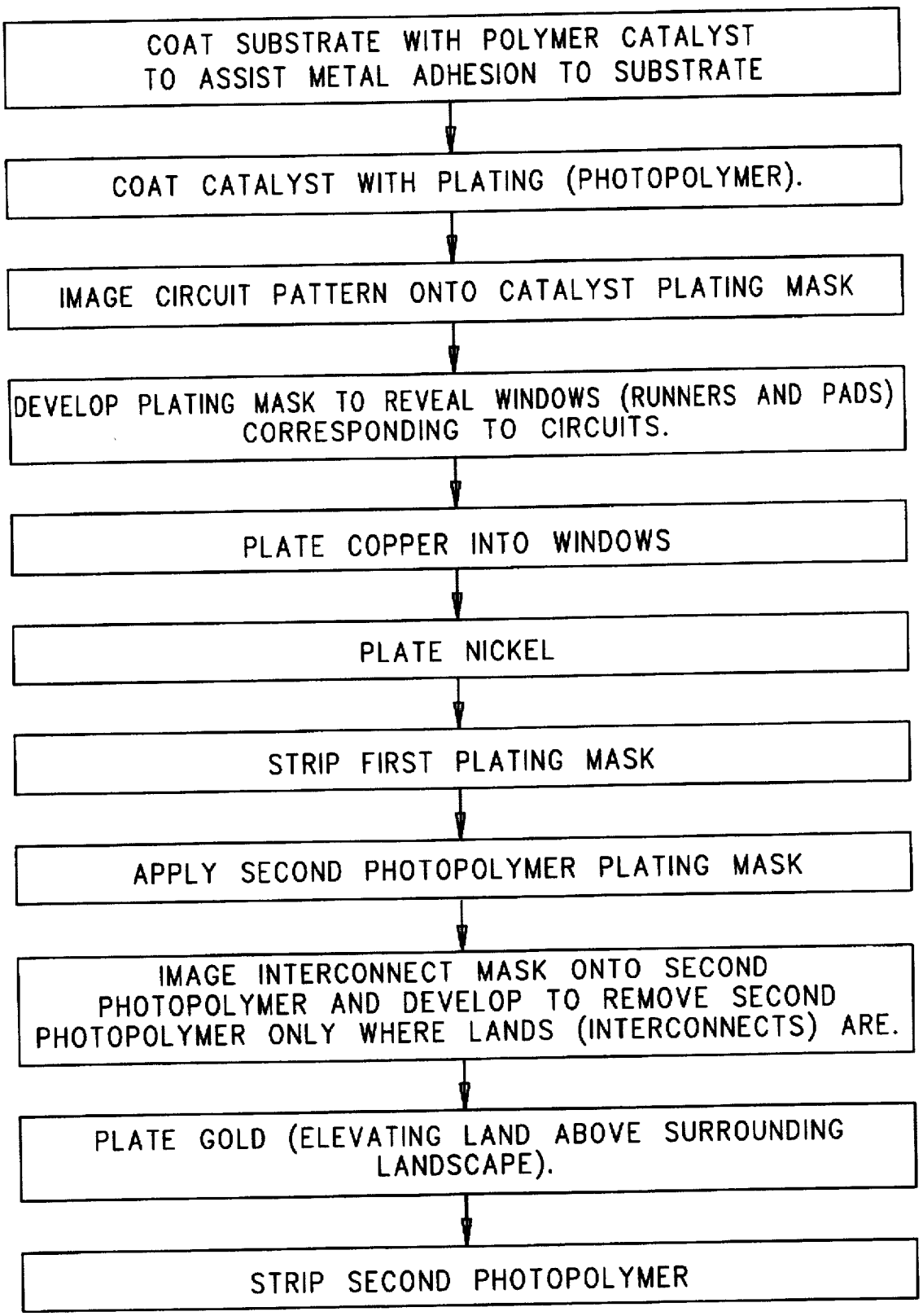
FIG. 1 is a block diagram showing the steps of the process of the instant invention.

Referring to FIG. 1, the preferred embodiment of the instant invention uses any standard form rigid or flexible substrate for use as a circuit carrier, coated with a polymer catalyst or other substance which assists in adhering conductive material to the substrate. The substrate is coated with a first plating mask photopolymer, or first plating resist, into which a circuit pattern is photo-optically imaged. The first plating mask photopolymer is developed so as to remove material therefrom corresponding to the circuit pattern, thereby leaving recessed runners and pads, or circuit traces, in the first plating resist corresponding to the circuit pattern. The recessed runners and pads are also sometimes referred to as "windows." The next step in the process is carried out by plating a first conductive material, such as copper, into the windows. Then, a second conductive material, preferably a material which tends to oxidize rapidly upon exposure to air such as nickel, may be plated into the windows on top of the first conductive material. In this way, the first conductive material is protected against solid state diffusion.

Next, the first plating resist is removed by any known means. Thereafter, a second plating mask photopolymer, or second plating resist, is coated upon the substrate so as to cover the polymer catalyst and first and second conductive materials. Next, an interconnect pattern is photo-optically imaged onto the second plating resist and the second plating resist thereafter developed to remove some of the second plating resist layer corresponding to the I/O lands, also known as "interconnect windows" or "openings."

Next, a third conductive material such as gold is plated into the interconnect windows.

The second conductive material, having a tendency to oxidize rapidly, performs the function of the omitted solder mask and prevents solder from wetting during reflow, i.e. upon mounting of the IC components to the interconnect pads.

Figure 2A:
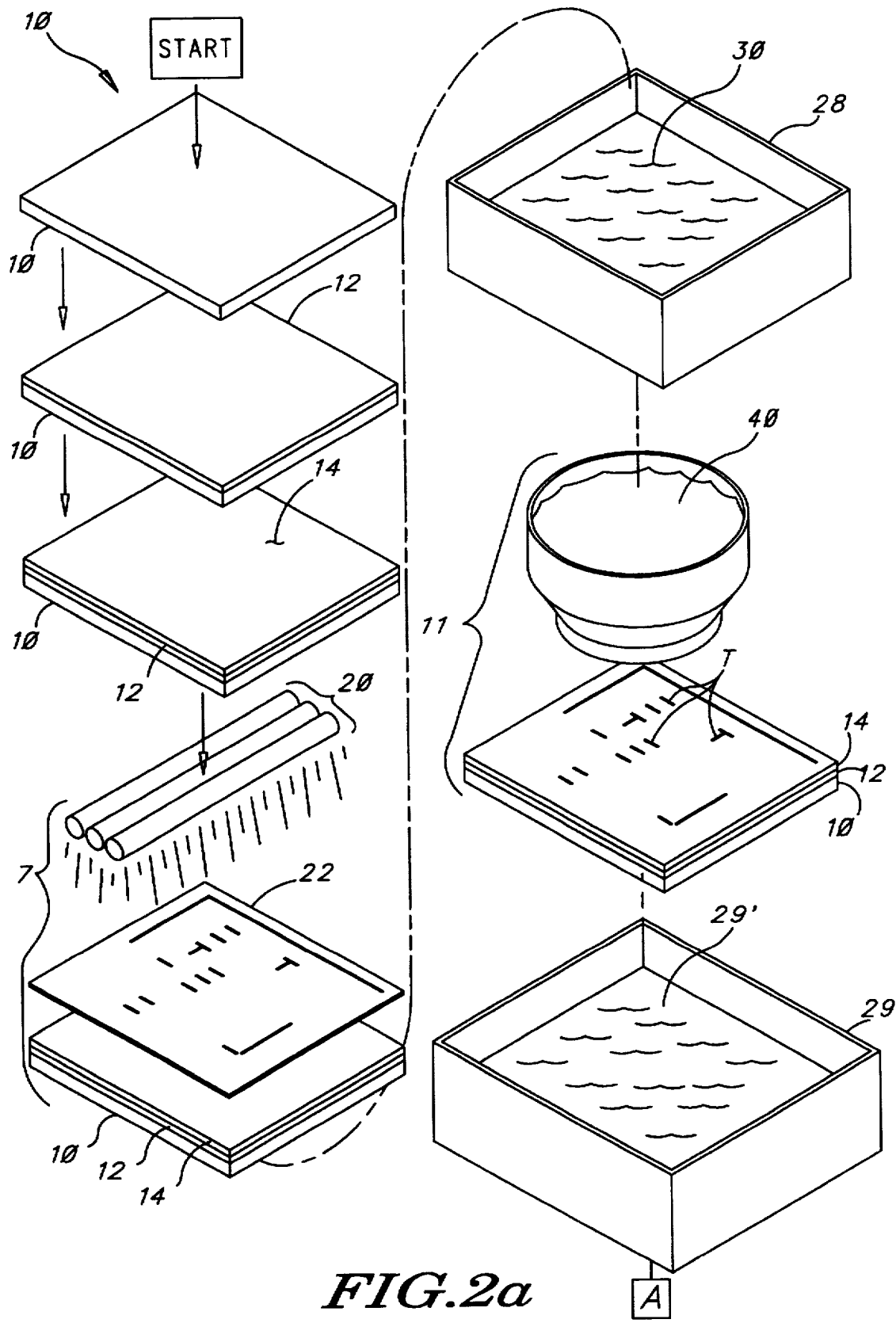
FIGS. 2a–c is a schematic of the process of the preferred embodiment of the instant invention.
Figure 2B:
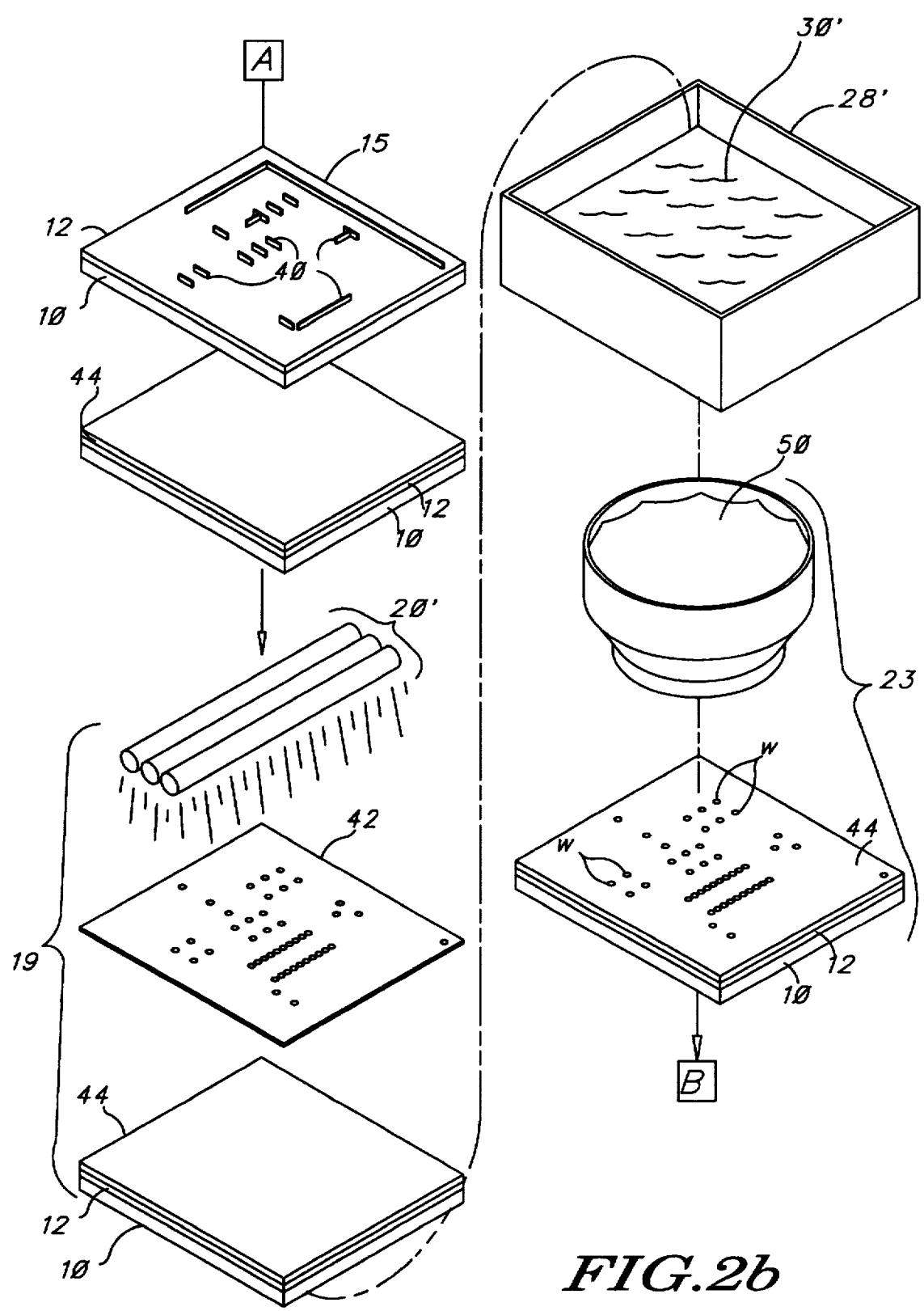
Figure 2C:
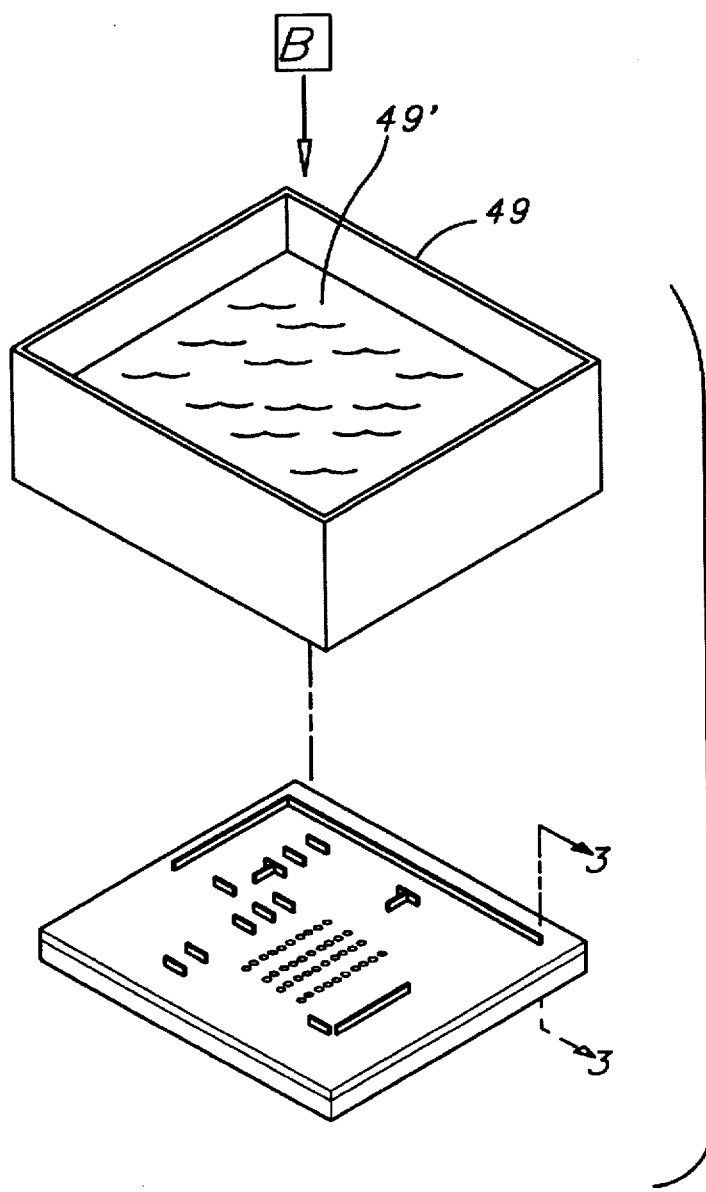

A more detailed depiction of the process is shown in FIGS. 2a–c. In FIG. 2a, a bare substrate 10 is provided, which is then coated with a catalyst layer 12 which facilitates the adhesion of the conductive circuit traces to the substrate. Typically, layer 12 is a polymer catalyst, but may be any suitable material, such as conventional palladium/tin catalysts, which accomplishes the function of assisting the conductive circuit trace material to adhere to the substrate. Thereafter, a first plating resist layer 14 is applied atop layer 12. Then, a circuit pattern is photo-optically imaged into the first plating resist layer 14 using a circuit pattern mask 22 as known in the art and a radiation source 20, which may be light, including ultraviolet (UV) and/or infrared (IR), or x-ray, or electron beam.

Thereafter, the first plating resist layer 14 is developed so that material is removed from layer 14 corresponding to the circuit pattern, leaving defined, recessed, windows, also known as circuit traces T, in layer 14. Layer 14 may be developed by any means known in the art, such as by the use of a developing device shown schematically as 28 in FIG. 2a, which utilizes a chemical wash such as developer 30. An example of a developing device and wash is standard Chemcut horizontal or vertical developer using a mildly basic sodium carbonate solution.

In the next step, a first conductive material 40, such as copper, is plated into the circuit traces T. Thereafter, a second conductive material 41 (not shown), such as nickel, may be plated into the circuit traces atop the first conductive material 40 in the same manner used to apply first conductive material 40.

Next, the first plating resist layer 14 is removed in its entirety from substrate 10 by means well known in the art, for example standard stripper using horizontal or vertical feed-through sprays of a highly basic sodium carbonate solution. An example of apparatus used for removing the first plating resist layer 14 is shown diagrammatically as 13, 29, and 29' in FIG. 2a. Element 29 depicts a wash facility through which a standard stripper 29' is applied to remove layer 14.

As shown in FIG. 2b, a second plating mask photopolymer, or plating resist, layer 44 is coated over the substrate 10 and polymer catalyst 12. An interconnect pattern is photo-optically imaged into the second plating resist layer 44 by any known means, such as by the use of interconnect mask 42 radiation source 20', which may be UV and/or IR, or x-ray or electron beam. Apertures in the interconnect mask correspond to prospective I/O lands on the circuit carrier.

Once the interconnect pattern is photo-imaged into the second plating resist layer 44, the second plating resist layer 44 is developed as described with respect to the first plating resist layer 14 and as shown schematically as 28' and 30' in FIG. 2b. Then, a third conductive material 50, such as gold, is plated into interconnect windows W which remain in second plating resist layer 44 after developing of the second plating resist layer 44.

As shown in FIG. 2a, the final step includes removal of the second plating resist layer 44 by any known method and/or apparatus, such as by the use of a standard stripper 49' applied to substrate 10 using wash stripper apparatus 49.

As stated above, the third conductive material which makes up the interconnect pads is preferably raised relative to the surrounding landscape on the substrate after the second plating resist layer 44 is removed to facilitate the connection of the I/O leads of the IC components thereto.

By use of the instant invention, interconnect accuracies are dramatically enhanced. Also, the serious drawbacks inherent in the use of solder mask are entirely eliminated. In addition, in creating flexible printed circuits, the instant invention is ideal, as solder mask adds substantially to the rigidity of the substrate. Use of the instant invention results in far greater flexibility, and hence adaptability, of the resultant circuit carrier. Also, the instant invention allows for reduced size of the interconnection between I/O leads due to the reduced pad size. Consequently, the distance between I/O pad centers, commonly referred to as "pitch," is reduced. What this means is that the I/O leads on the IC components can be closer together, a highly desirable result in light of the continued pursuit of miniaturized IC components.

Figure 3:
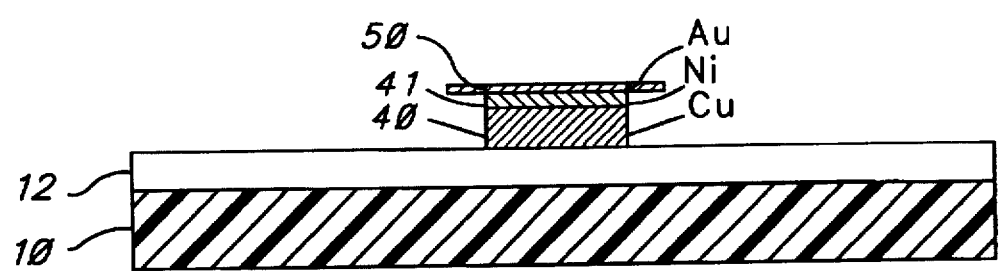
FIG. 3 is a cross section of a representative PCB created by the process of the instant invention.

FIG. 3 shows a cross section of a representative circuit carrier created in accordance with the instant invention. As can be seen, substrate 10 has applied thereover polymer catalyst layer 12. No additional coatings of any kind are necessary other than in places where circuit traces, I/O lands, or pass-throughs are located. In the example shown, substrate 10 is coated with a polymer catalyst layer 12, which in turn supports first conductive material 40 in the form of circuit traces. In one form, the first conductive material is copper, plated to a depth of 0.0005". Atop the first conductive material is a second, oxidizable, conductive material 41, which, as mentioned above, can be nickel, plated to a depth of 0.00015". At points where I/O interconnections occur, third conductive material 50 is supported by the second conductive material 41. Third conductive material 50 can be, as stated above, gold, and may be plated to a depth of between 0.000005" and 0.000015".

In an alternative form, the process of the instant invention may be carried out by skipping the step of stripping the first plating resist layer 14 prior to applying the second plating resist layer 44. This would eliminate the need to pass the stripper and developer twice, reducing chemical stripper consumption and the possibility of incomplete stripping or developing, which results in a residue being left behind called "scumming," which interferes with subsequent plating operations and/or can cause delamination failures during assembly.

In the foregoing specification, the invention has been described with reference to specific embodiments thereof. It will, however, be evident that various modifications and changes may be made thereto without departing from the broader spirit or scope of the invention as set forth in the following claims. For example, the specific materials referred to herein are exemplary. Any other suitable materials are contemplated for use with the instant invention. Likewise, the parameters of any radiation sources or developing apparatus and/or chemicals used to complete the processes described herein may vary within a wide range of acceptable values. The specification and drawings are, accordingly, to be regarded in an illustrative rather than a restrictive sense.

What is claimed is:

1. A method for plating a substrate to eliminate the need for a solder mask during subsequent component solder attachment processes, said method comprising the steps of:
   (a) coating said substrate with a polymer catalyst;
   (b) coating the polymer catalyst with a first plating mask photopolymer;
   (c) photo-optically imaging a circuit pattern onto the first plating mask photopolymer by placing a circuit mask thereover and exposing the circuit mask and first plating mask photopolymer to a predetermined wavelength of radiant energy for a predetermined duration;
   (d) developing the thus exposed first plating mask photopolymer so as to remove a portion of said first plating mask photopolymer, thereby forming windows therein, corresponding to said circuit pattern;
   (e) at least partially filling said windows with copper;
   (f) covering said copper with nickel, said nickel oxidizing rapidly when exposed to air, thereby rendering the exposed surface of said nickel unsolderable;
   (g) removing said first plating mask photopolymer from said substrate without removing said copper or nickel or said polymer catalyst;
   (h) coating said polymer catalyst and nickel with a second plating mask photopolymer;
   (i) photo-optically imaging an interconnect pattern onto said second plating mask photopolymer by placing an interconnect mask thereover and exposing said interconnect mask and second plating mask photopolymer to a predetermined wavelength of radiant energy for a predetermined duration;
   (j) developing the thus exposed second plating mask photopolymer so as to remove a portion of said second plating mask photopolymer corresponding to said interconnect pattern;
   (k) plating over said interconnect pattern with gold;
   (l) removing said second plating mask photopolymer from said substrate without removing said copper, nickel, or gold,
   wherein said nickel selectively prevents adhesion of solder which is applied to said substrate to provided electrical interconnection between said circuit pattern and an external component.

2. The method for plating a substrate as recited in claim 1, wherein said predetermined duration is sufficient to obtain a desired circuit trace depth.

3. The method for plating a substrate as recited in claim 1, wherein said predetermined wavelength of radiant energy is between 300–500 nanometers.

4. The method for plating a substrate as recited in claim 1, wherein copper is deposited into said windows to a depth of between 0.0001"–0.0005".

5. The method for plating a substrate as recited in claim 1, wherein nickel is deposited into said windows to a depth of between 0.0001"–0.0003".

6. The method for plating a substrate as recited in claim 1, wherein gold is deposited into said windows to a depth of between 0.000005"–0.000015".

7. The method for plating a substrate as recited in claim 1, wherein the step of at least partially filling said windows with copper is carried out using an electroless plating process.

8. The method for plating a substrate as recited in claim 7, wherein the step of covering said copper with nickel is carried out using an electroless plating process.

9. The method for plating a substrate as recited in claim 8, wherein the step of plating over said interconnect pattern with gold is carried out using an electroless plating process.

10. A method for plating a substrate to eliminate the need for a solder mask during subsequent component solder attachment processes, said method comprising the steps of:
    (a) coating said substrate with a polymer catalyst;
    (b) coating the polymer catalyst with a first plating mask photopolymer;
    (c) photo-optically imaging a circuit pattern onto the first plating mask photopolymer by placing a circuit mask thereover and exposing the circuit mask and first plating mask photopolymer to a predetermined wavelength of radiant energy for a predetermined duration;
    (d) developing the thus exposed first plating mask photopolymer so as to remove a portion of said first plating mask photopolymer, thereby forming windows therein, corresponding to said circuit pattern;
    (e) at least partially filling said windows with copper;
    (f) covering said copper with nickel, said nickel oxidizing rapidly when exposed to air, thereby rendering the exposed surface of said nickel unsolderable;
    (g) coating said first plating mask photopolymer and nickel with a second plating mask photopolymer;
    (h) photo-optically imaging an interconnect pattern onto said second plating mask photopolymer to a predetermined wavelength of radiant energy for a predetermined duration;
    (i) developing the thus exposed second plating mask photopolymer so as to remove a portion of said second plating mask photopolymer corresponding to said interconnect pattern;
    (j) plating over said interconnect pattern with gold;
    (k) removing said second plating mask photopolymer from said substrate without removing said copper, nickel, or gold.

11. The method for plating a substrate as recited in claim 10, wherein said predetermined duration is sufficient to obtain a desired circuit trace depth.

12. The method for plating a substrate as recited in claim 10, wherein said predetermined wavelength of radiant energy is between 300–500 nanometers.

13. The method for plating a substrate as recited in claim 10, wherein copper is deposited into said windows to a depth of between 0.0001"–0.0005".

14. The method for plating a substrate as recited in claim 10, wherein nickel is deposited into said windows to a depth of between 0.0001"–0.0003".

15. The method for plating a substrate as recited in claim 10, wherein gold is deposited into said windows to a depth of between 0.000005"–0.0000015".

16. A method for plating a substrate to eliminate the need for a solder mask during subsequent component solder attachment processes, said method comprising the steps of:
    (a) coating said substrate with a polymer catalyst;

(b) coating the polymer catalyst with a first plating mask photopolymer;

(c) photo-optically imaging a circuit pattern onto the first plating mask photopolymer by placing a circuit mask thereover and exposing the circuit mask and first plating mask photopolymer to a predetermined wavelength of radiant energy for a predetermined duration;

(d) developing the thus exposed first plating mask photopolymer so as to remove a portion of said first plating mask photopolymer, thereby forming windows therein, corresponding to said circuit pattern;

(e) at least partially filling said windows with a first conductive material;

(f) covering said first conductive material with a second conductive material, said second conductive material oxidizing rapidly when exposed to air, thereby rendering the exposed surface of said second conductive material unsolderable;

(g) removing said first plating mask photopolymer from said substrate without removing said first or said second conductive materials or said polymer catalyst;

(h) coating said polymer catalyst and said second conductive material with a second plating mask photopolymer;

(i) photo-optically imaging an interconnect pattern onto said second plating mask photopolymer by placing an interconnect mask thereover and exposing said interconnect mask and second plating mask photopolymer to a predetermined wavelength of radiant energy for a predetermined duration;

(j) developing the thus exposed second plating mask photopolymer so as to remove a portion of said second plating mask photopolymer corresponding to said interconnect pattern;

(k) plating over said interconnect pattern with a third conductive material;

(l) removing said second plating mask photopolymer from said substrate without removing said first conductive material, said second conductive material, or said third conductive material.

17. The method for plating a substrate as recited in claim 16, wherein said predetermined duration is sufficient to obtain a desired circuit trace depth.

18. The method for plating a substrate as recited in claim 16, wherein said predetermined wavelength of radiant energy is between 300–500 nanometers.

19. The method for plating a substrate as recited in claim 16, wherein copper is deposited into said windows to a depth of between 0.0001"–0.0005".

20. The method for plating a substrate as recited in claim 16, wherein nickel is deposited into said windows to a depth of between 0.0001"–0.0003".

21. The method for plating a substrate as recited in claim 16, wherein gold is deposited into said windows to a depth of between 0.000005"–0.0000015".

22. A method for plating a substrate to eliminate the need for a solder mask during subsequent component solder attachment processes, said substrate being coated with a means for facilitating the adherence of a first conductive material to said substrate, said method comprising the steps of:

(a) coating said means for facilitating with a first plating mask photopolymer;

(b) photo-optically imaging a circuit pattern onto the first plating mask photopolymer by placing a circuit mask thereover and exposing the circuit mask and first plating mask photopolymer to a predetermined wavelength of radiant energy for a predetermined duration;

(c) developing the thus exposed first plating mask photopolymer so as to remove a portion of said first plating mask photopolymer, thereby forming windows therein, corresponding to said circuit pattern;

(d) at least partially filling said windows with a first conductive material;

(e) covering said first conductive material with a second conductive material, said second conductive material oxidizing rapidly when exposed to air, thereby rendering the exposed surface of said second conductive material unsolderable;

(f) removing said first plating mask photopolymer from said substrate without removing said first or said second conductive materials or said polymer catalyst;

(g) coating said polymer catalyst and said second conductive material with a second plating mask photopolymer;

(h) photo-optically imaging an interconnect pattern onto said second plating mask photopolymer by placing an interconnect mask thereover and exposing said interconnect mask and second plating mask photopolymer to a predetermined wavelength of radiant energy for a predetermined duration;

(i) developing the thus exposed second plating mask photopolymer so as to remove a portion of said second plating mask photopolymer corresponding to said interconnect pattern;

(j) plating over said interconnect pattern with a third conductive material;

(k) removing said second plating mask photopolymer from said substrate without removing said first conductive material, said second conductive material, or said third conductive material.

23. The method for plating a substrate as recited in claim 22, wherein said predetermined duration is sufficient to obtain a desired circuit trace depth.

24. The method for plating a substrate as recited in claim 22, wherein said predetermined wavelength of radiant energy is between 300–500 nanometers.

25. The method for plating a substrate as recited in claim 22, wherein copper is deposited into said windows to a depth of between 0.0001"–0.0005".

26. The method for plating a substrate as recited in claim 22, wherein nickel is deposited into said windows to a depth of between 0.0001"–0.0003".

27. The method for plating a substrate as recited in claim 22, wherein gold is deposited into said windows to a depth of between 0.000005"–0.0000015".

28. A method for plating a substrate to eliminate the need for a solder mask during subsequent component solder attachment processes, said substrate being coated with a means for facilitating the adherence of a first conductive material to said substrate, said method comprising the steps of:

(a) coating said means for facilitating with a first plating mask photopolymer;

(b) photo-optically imaging a circuit pattern onto the first plating mask photopolymer by placing a circuit mask thereover and exposing the circuit mask and first plating mask photopolymer to a predetermined wavelength of radiant energy for a predetermined duration;

(c) developing the thus exposed first plating mask photopolymer so as to remove a portion of said first plating mask photopolymer, thereby forming windows therein, corresponding to said circuit pattern;

(d) at least partially filling said windows with a first conductive material;

(e) covering said first conductive material with a second conductive material, said second conductive material oxidizing rapidly when exposed to air, thereby rendering the exposed surface of said second conductive material unsolderable;

(f) coating said polymer catalyst and said second conductive material with a second plating mask photopolymer;

(g) photo-optically imaging an interconnect pattern onto said second plating mask photopolymer by placing an interconnect mask thereover and exposing said interconnect mask and second plating mask photopolymer to a predetermined wavelength of radiant energy for a predetermined duration;

(h) developing the thus exposed second plating mask photopolymer so as to remove a portion of said second plating mask photopolymer corresponding to said interconnect pattern; and (i) plating over said interconnect pattern with a third conductive material.

29. The method for plating a substrate as recited in claim 28, wherein said first plating mask photopolymer is removed from said substrate without removing said first or said second conductive materials or said polymer catalyst.

30. The method for plating a substrate as recited in claim 28, wherein said second plating mask photopolymer is removed from said substrate without removing said first conductive material, said second conductive material, or said third conductive material.

* * * * *